(12) United States Patent
Wu et al.

(10) Patent No.: US 9,789,448 B2
(45) Date of Patent: Oct. 17, 2017

(54) PROCESS FOR TREATING FLUID

(71) Applicant: Taiwan Semiconductor Manufacturing Co., Ltd, Hsin-Chu (TW)

(72) Inventors: Shing-Fong Wu, Hsinchu (TW); Yung-Ti Hung, Hsinchu (TW); Shih-Pao Chien, Jhunan Township (TW); Yen-Chen Chen, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 636 days.

(21) Appl. No.: 14/163,261

(22) Filed: Jan. 24, 2014

(65) Prior Publication Data
US 2015/0214035 A1    Jul. 30, 2015

(51) Int. Cl.
*B01F 3/04* (2006.01)
*C11D 11/00* (2006.01)
(Continued)

(52) U.S. Cl.
CPC ...... *B01F 3/04503* (2013.01); *B01F 3/04106* (2013.01); *B01F 3/04737* (2013.01);
(Continued)

(58) Field of Classification Search
CPC .............. B01F 3/04503; B01F 3/04106; B01F 3/04737; B01F 3/04985; B01F 5/106; B01F 13/1027; B01F 15/00227; C11D 7/04; C11D 11/0047; C11D 11/0094; H01L 21/67017
(Continued)

(56) References Cited

U.S. PATENT DOCUMENTS

| 4,211,733 A * | 7/1980 | Chang | B01F 3/0876 210/220 |
| 7,264,006 B2 * | 9/2007 | Fittkau | B01F 3/04496 134/1.3 |
| 7,617,836 B2 * | 11/2009 | Kim | C01B 5/00 137/2 |

(Continued)

FOREIGN PATENT DOCUMENTS

| CN | 102129957 A | 7/2011 |
| TW | I278898 B | 4/2007 |

(Continued)

*Primary Examiner* — Katelyn Whatley
(74) *Attorney, Agent, or Firm* — Birch, Stewart, Kolasch & Birch, LLP

(57) ABSTRACT

Embodiments of a process for treating a fluid are provided. The process for treating a fluid includes supplying a first fluid to a circulating chamber and introducing a first gas to the first fluid. A portion of the first gas is dissolved in the first fluid and a portion of the first gas is held in a head space portion of the circulating chamber. The process further includes mixing a portion of the first fluid drawn out from the circulating chamber and a portion of the first gas drawn out from the head space portion to form a mixture. The process further includes spraying the mixture back into the circulating chamber by a two-fluid nozzle. In addition, the first gas is further dissolved into the first fluid to form a high conductivity fluid. The process further includes draining the high conductivity fluid from the circulating chamber.

18 Claims, 10 Drawing Sheets

(51) Int. Cl.
    *C11D 7/04*     (2006.01)
    *H01L 21/67*     (2006.01)
    *B01F 5/10*     (2006.01)
    *B01F 13/10*     (2006.01)
    *B01F 15/00*     (2006.01)

(52) U.S. Cl.
    CPC .......... *B01F 3/04985* (2013.01); *B01F 5/106* (2013.01); *B01F 13/1027* (2013.01); *B01F 15/00227* (2013.01); *C11D 7/04* (2013.01); *C11D 11/0047* (2013.01); *C11D 11/0094* (2013.01); *H01L 21/67017* (2013.01)

(58) Field of Classification Search
    USPC ..................................... 134/18; 261/16, 36.1
    See application file for complete search history.

(56) References Cited

U.S. PATENT DOCUMENTS

| | | | |
|---|---|---|---|
| 2003/0136763 A1* | 7/2003 | Nakagawa | C09G 1/02 216/83 |
| 2007/0141849 A1 | 6/2007 | Kanno et al. | |
| 2009/0062407 A1* | 3/2009 | Iversen | B01D 11/00 516/10 |
| 2011/0134716 A1* | 6/2011 | Seiwert | C02F 1/685 366/101 |

FOREIGN PATENT DOCUMENTS

| | | |
|---|---|---|
| TW | I289334 B | 11/2007 |
| TW | I363382 B | 5/2012 |

* cited by examiner

PROCESS FOR TREATING FLUID

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

In addition, processes for forming the semiconductor devices described above usually include a cleaning process, and a fluid may be used in the cleaning process. Although existing methods for forming the fluid used in the cleaning process have been generally adequate for their intended purposes, they have not been entirely satisfactory in all respects.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for treating a fluid are provided in accordance with some embodiments of the disclosure. In some embodiments, the conductivity of the fluid is adjusted, and the treated fluid is configured to be used in a cleaning process. In addition, the cleaning process may be used during the formation of a semiconductor structure.

Figure 1:
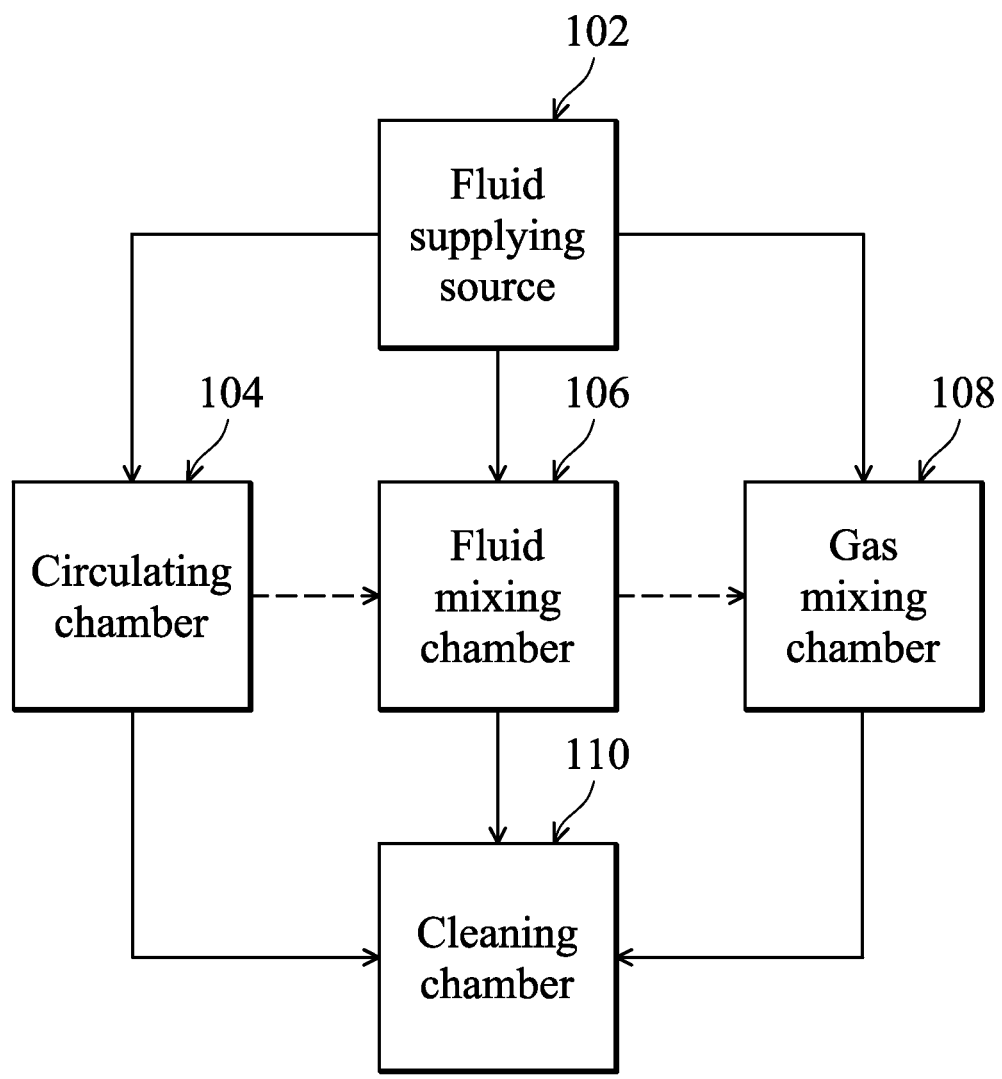
FIG. 1 illustrates a schematic drawing for treating a fluid in accordance with some embodiments.

FIG. 1 illustrates schematic drawing for treating a fluid in accordance with some embodiments. The fluid is transferred from a fluid supplying source 102 to a circulating chamber 104, a fluid mixing chamber 106, or a gas mixing chamber 108 to form a treated fluid. Next, the treated fluid is transferred to a cleaning chamber 110 for performing a cleaning process. In some embodiments, the fluid is treated in circulating chamber 104 to have a greater conductivity. In some embodiments, the fluid is treated in fluid mixing chamber 106 to dynamically mix with another fluid. In some embodiments, the fluid is treated in gas mixing chamber 108 to adjust and stable the conductivity of the fluid. In some embodiments, the treated fluid is further transferred to cleaning chamber 110 to clean a semiconductor structure. In some embodiments, cleaning chamber 110 is a tool's cleaning chamber.

Furthermore, in some embodiments, circulating chamber 104 is further coupled to fluid mixing chamber 106, and fluid mixing chamber 106 is coupled to the gas mixing chamber 108. The details of the fluid treating processes illustrated in FIG. 1 are described below.

Figure 2:
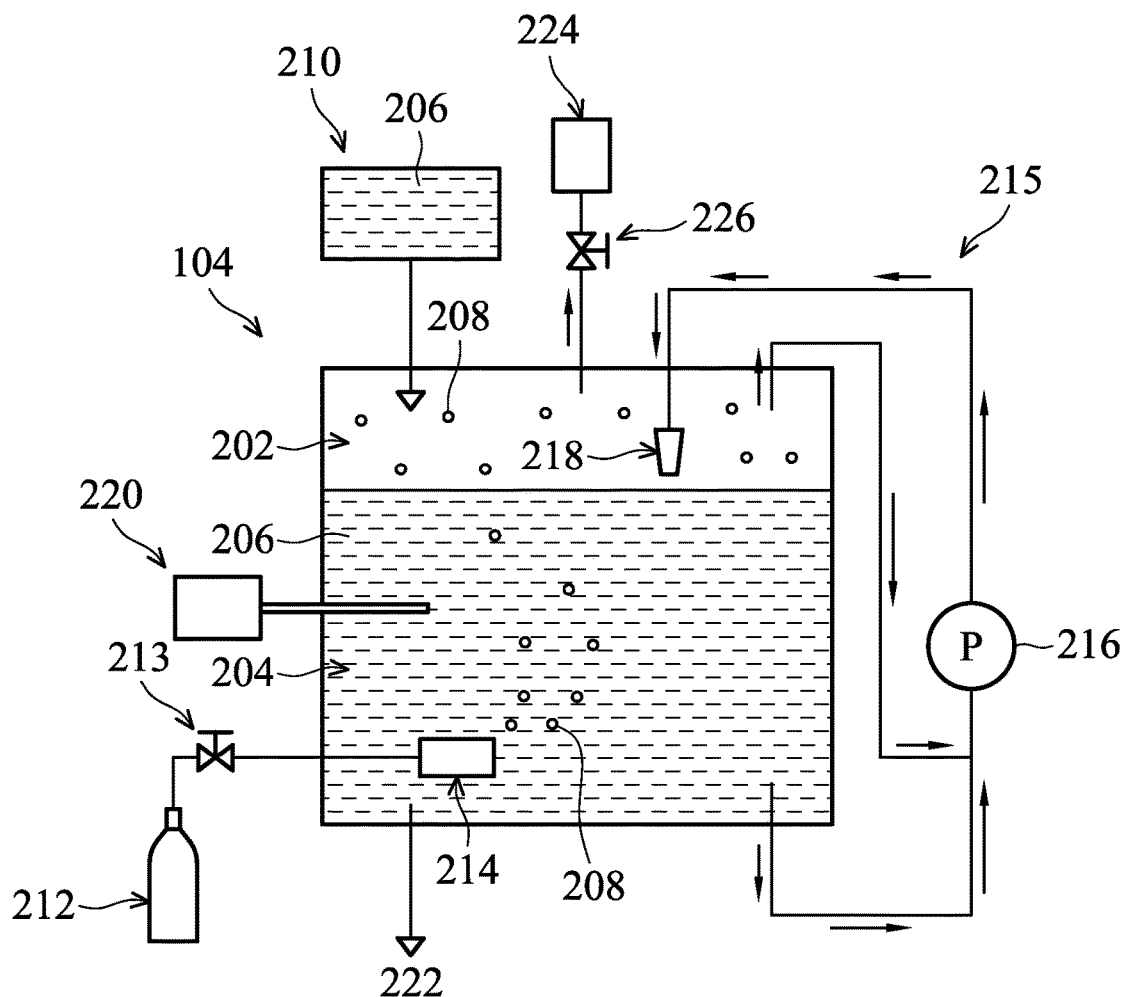
FIG. 2 illustrates a schematic drawing of a circulating chamber in accordance with some embodiments.

FIG. 2 illustrates a schematic drawing of circulating chamber 104 in accordance with some embodiments. A first fluid source 210 is coupled to circulating chamber 104 for supplying a first fluid 206 to circulating chamber 104 in accordance with some embodiments. In some embodiments, first fluid 206 are solutions such as deionized water, city water, or the like. In some embodiments, first fluid 206 is deionized water.

Circulating chamber 104 has a head space portion 202 and a fluid-containing portion 204. Fluid-containing portion 204 is configured to contain first fluid 206. In some embodiments, the ratio of the size of head space portion 202 to the size of circulating chamber 104 is in a range from about 20% to 90%. In some embodiments, the size of circulating chamber 104 is in a range from $10 \times 10 \times 10$ cm$^3$ to $1000 \times 1000 \times 1000$ cm$^3$.

A valve (not shown) may communicate with first fluid source 210 and circulating chamber 104 for controlling the amount of first fluid 206 introduced into circulating chamber 104.

A first gas source 212 is coupled to circulating chamber 104 for introducing a first gas 208 to circulating chamber 104 by a gas diffuser 214 in accordance with some embodiments. As shown in FIG. 2, first gas source 212 is in communication with gas diffuser 214, and gas diffuser 214 extends into first fluid 206. Accordingly, first gas 208 is introduced to first fluid 206 by gas diffuser 214, such that a portion of first gas 208 can be dissolved in first fluid 206. In some embodiments, gas diffuser 214 transforms first gas 208 into small bubbles, which have a greater surface area contacting first fluid 206. Therefore, the dissolving rate of first gas 208 in first fluid 206 is improved.

As shown in FIG. 2, a portion of first gas 208 is not dissolved in first fluid 206 in accordance with some embodiments. In addition, the portion of first gas 208 passes through first fluid 206 to reach head space portion 202 of circulating chamber 104. Accordingly, fluid-containing portion 204 contains first fluid 206, and head space portion 202 over fluid-containing portion 204 contains a portion of first gas 208.

In some embodiments, first gas 208 includes carbon dioxide, nitrogen, oxygen, argon, xenon, helium, krypton, or combinations thereof. In some embodiments, first gas 208 is carbon dioxide. In some embodiments, first gas 208 has a flow rate in a range from about 1 cc/min to about 100 cc/min.

In addition, a rotameter (not shown), a pressure regulator (not shown), and a valve 213 are in communication with first gas source 212 and circulating chamber 104 in accordance with some embodiments. The rotameter and valve 213 are configured to control the amount and the flow rate of first gas 208 introduced to circulating chamber 104. The pressure regulator is configured to control the pressure of first gas 208 introduced to circulating chamber 104.

A circulating system 215 includes a pump 216 and a two-fluid nozzle 218 is coupled to circulating chamber 104 in accordance with some embodiments. Pump 216 is configured to draw out first gas 208 from head space portion 202 and draw out first fluid 206 from fluid-containing portion 204. In addition, first gas 208 drawn from head space portion 202 and first fluid 206 drawn from fluid-containing portion 204 are mixed to form a mixture. The mixture is transferred to two-fluid nozzle 218.

Two-fluid nozzle 218 is coupled to pump 216 and is positioned in head space portion 202 of circulating chamber 104 in accordance with some embodiments. Two-fluid nozzle 218 is configured to spray the mixture of first gas 208 and first fluid 206 drawn by pump 216 to circulating chamber 104. Furthermore, in some embodiments, first gas 208 in head space portion 202 is also sucked into two-fluid nozzle 218 to mixed with the mixture drawn by pump 216. Arrows shown in FIG. 2 illustrate the direction of first gas 208 and first fluid 206 circulated by pump 216.

As described above, first gas 208 is introduced to first fluid 206 by gas diffuser 214, and a portion of first gas 208 is dissolved in first fluid 206. In addition, another portion of first gas 208 passes through first fluid 206 and is held in head space portion 202 of circulating chamber 104. The portion of first gas 208 in head space portion 202 is drawn out by pump 216 and re-mixed with first fluid 206. Therefore, first gas 208 which is not dissolved in first fluid 206 when being introduced to first fluid 206 can be re-used to be mixed with first fluid 206. In addition, the mixture, which includes first fluid 206 and first gas 208 dissolved therein, is further transferred to two-fluid nozzle 218 and is sprayed back to circulating chamber 104. Furthermore, in some embodiments, first gas 208 in head space portion 202 is also sucked into two-fluid nozzle 218 to be mixed with the mixture. Therefore, first gas 208 may be further dissolved in first fluid 206 by using two-fluid nozzle 218. As a result, the dissolving rate of first gas 208 is improved by circulating system 215, and first fluid 206 is transformed into a high conductivity fluid.

In some embodiments, a conductivity meter 220 is coupled to circulating chamber 104. Conductivity meter 220 is configured to measure the conductivity of first fluid 206. When the conductivity of first fluid 206 reaches a determined value, first fluid 206 can be seen as being transformed into the high conductivity fluid. In some embodiments, the high conductivity fluid is expelled from a drain 222. In some embodiments, the conductivity of the resulting high conductivity fluid is in a range from about 1 μs/cm to about 250 μs/cm. In some embodiments, the conductivity of the resulting high conductivity fluid is in a range from about 1 μs/cm to about 200 μs/cm.

In some embodiments, a back pressure regulator 224 is coupled to circulating chamber 104. Back pressure regulator 224 is configured to control the pressure of circulating chamber 104. For example, when too much first gas 208 is introduced to circulating chamber 104 resulting in the pressure of circulating chamber 104 being too high, a portion of first gas 208 may be released from circulating chamber 104 by back pressure regulator 224. In some embodiments, the pressure of circulating chamber 104 is in a range from about 1 atm to about 10 atm. In some embodiments, a valve 226 is in communication with head space portion 202 of circulating chamber 104.

In some embodiments, first fluid 206 is deionized water, and first gas 208 is carbon dioxide. The resulting high conductivity fluid may be used to clean a semiconductor structure in a cleaning process. In some embodiments, the semiconductor structure includes a substrate, a gate structure, source and drain regions, or combinations thereof. Since the high conductivity fluid is formed by dissolving first gas 208 to first fluid 206, the high conductivity fluid is clean and can be used to clean the semiconductor structure effectively without damaging the semiconductor structure. In some embodiments, the dissolving rate of carbon dioxide in deionized water using circulating chamber 104 including circulating system 215 described above is twice as fast as the dissolving rate of carbon dioxide in deionized water without using circulating system 215.

Figure 3:
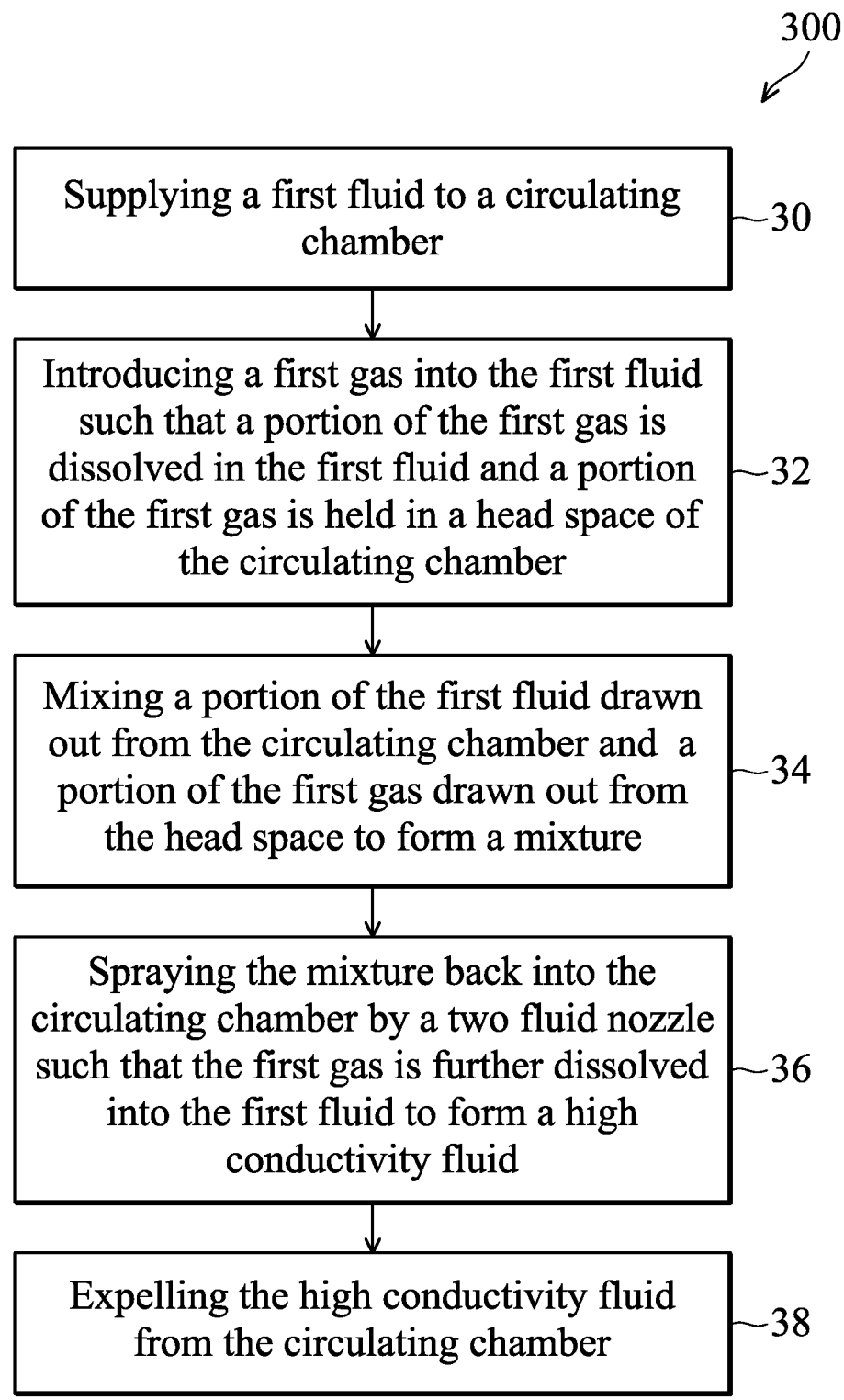
FIG. 3 illustrates a flow chart of a process for forming a high conductivity fluid in accordance with some embodiments.

FIG. 3 illustrates a flow chart of a process 300 for forming a high conductivity fluid in accordance with some embodiments. In some embodiments, process 300 is performed by using circulating chamber 104 illustrated in FIG. 2.

In operation 30, a first fluid (e.g. first fluid 206) is supplied to a circulating chamber (e.g. circulating chamber 104). In operation 32, a first gas (e.g. first gas 208) is introduced to the first fluid, such that a portion of the first gas is dissolved in the first fluid and a portion of the first gas is held in a head space portion (e.g. head space portion 202) of the circulating chamber. That is, the first gas and the first fluid are mixed for the first time during operation 32.

In operation 34, a portion of the first fluid drawn out from the circulating chamber and a portion of the first gas drawn out from the head space portion are mixed to form a mixture. That is, the first gas and the first fluid are mixed for the second time during operation 34. As described previously, the first fluid and the first gas are drawn out by pump 216 in accordance with some embodiments.

In operation 36, the mixture is sprayed back into the circulating chamber by a two-fluid nozzle (e.g. two-fluid nozzle 218). In some embodiments, the first gas in the head space portion is sucked by the two-fluid nozzle and mixed with the mixture. That is, the first gas and the first fluid are mixed for the third time during operation 36.

Accordingly, by using a circulating system including the pump and the two-fluid nozzle, the first gas is repeatedly mixed with the first fluid. Therefore, the dissolving rate of the first gas in the first fluid is improved, and a high conductivity fluid is formed. In operation 38, the high conductivity fluid is drained out from the circulating chamber. The high conductivity fluid drained out from the circulating chamber may be further treated by other fluid treating processes or may be used directly, such as in a cleaning process for forming a semiconductor structure.

In some embodiments, operations 30 to 38 described above may be performed under a relatively high pressure (e.g. in a range from about 1 atm to about 10 atm). Therefore, the high conductivity fluid can reach a relatively high conductivity.

As illustrated in FIGS. 2 and 3 and described previously, first fluid 206 is treated in circulating chamber 104 in accordance with some embodiments. More specifically, first gas 208 is dissolved in first fluid 206 to form the high conductivity fluid. The high conductivity fluid formed by dissolving first gas 208 in first fluid is relatively clean (without containing other impurities) and may be applicable for use in a cleaning process.

In addition, circulating system 215 including pump 216 and two-fluid nozzle 218 enable the dissolving rate of first gas 208 in first fluid 206 to be improved. Moreover, first fluid 206 is continuously pump out and sprayed back by circulating system 215, and therefore the conductivity of first fluid 206 in circulating chamber 104 becomes more uniform. Furthermore, first gas 206 is re-used repeatedly in circulating system 215, and the amount of first gas 206 used in circulating chamber 104 is reduced. Therefore, the cost for forming the high conductivity fluid is reduced.

In some embodiments, first gas 208 is introduced to first fluid 206 through gas diffuser 210. Gas diffuser 210 transforms first gas 208 into small bubbles, and the small bubbles have relatively large surface area contacting first fluid 206. Therefore, the dissolving rate of first gas 208 is also improved accordingly. In addition, back pressure regulator 224 is also coupled to circulating chamber 104 in accordance with some embodiments. Therefore, first fluid 206 treated by circulating chamber 104 can have a relatively high conductivity.

Figure 4:
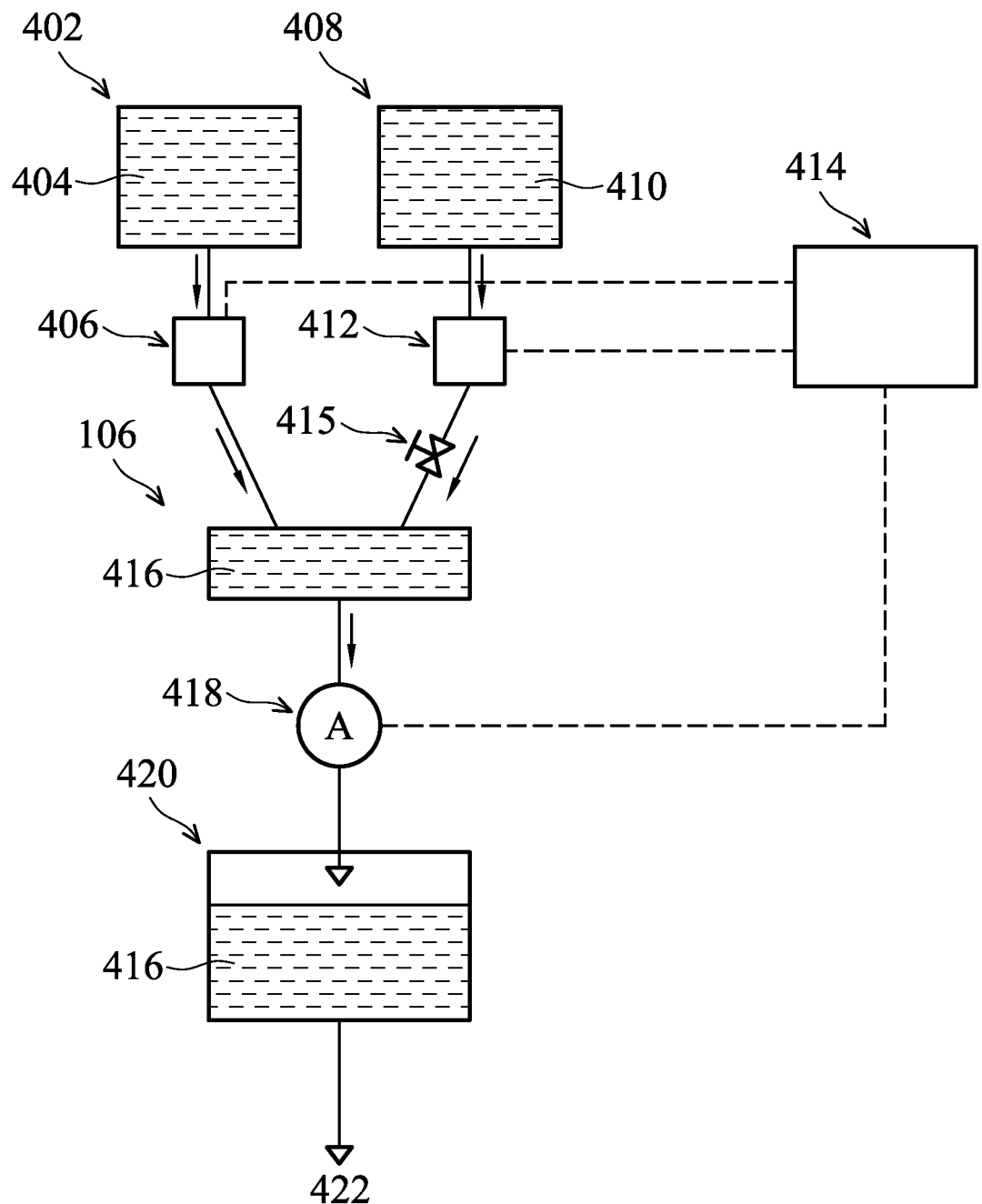
FIG. 4 illustrates a schematic drawing of a fluid mixing chamber in accordance with some embodiments.

FIG. 4 illustrates a schematic drawing of fluid mixing chamber 106 in accordance with some embodiments. A second fluid source 402 is coupled to fluid mixing chamber 106 in accordance with some embodiments. Second fluid source 402 is configured to supply a second fluid 404 to fluid mixing chamber 106. In some embodiments, second fluid 404 are solutions such as high conductivity fluid or high concentration fluid or saturated solution. In some embodiments, second fluid 404 is the high conductivity fluid treated by and supplied from circulating chamber 104 illustrated in FIG. 2.

In some embodiments, a first flow meter 406 is coupled to second fluid source 402. Second fluid source 402 has a first flow rate, and first flow meter 406 is configured to measure the first flow rate of second fluid 404. The direction of second fluid 404 is shown by arrows in FIG. 4.

A third fluid source 408 is also coupled to fluid mixing chamber 106 in accordance with some embodiments. Third fluid source 408 is configured to supply a third fluid 410 to fluid mixing chamber 106. In some embodiments, third fluid 410 are solutions such as deionized water, city water, or the like. In some embodiments, third fluid 410 is deionized water.

In some embodiments, a second flow meter 412 is further coupled to third fluid source 408. Third fluid source 410 has a second flow rate, and second flow meter 412 is configured to measure the second flow rate of third fluid 408. The direction of third fluid 408 is shown by arrows in FIG. 4.

A proportional-integral-derivative (PID) controller 414 is coupled to first flow meter 406 and second flow meter 412 in accordance with some embodiments. PID controller 414 is configured to sense the first flow rate of second fluid 404 and control the second flow rate of third fluid 410 accordingly. In some embodiments, a valve 415 is coupled to second flow meter 412 for controlling the amount and the flow rate of third fluid 410 being sent to fluid mixing chamber 106. The direction of third fluid 408 is indicated by arrows, as shown in FIG. 4.

Second fluid 404 and third fluid 410 are mixed in fluid mixing chamber 106 to form a mixed fluid 416 in accordance with some embodiments. In some embodiments, mixed fluid 416 has a conductivity in a range from about 1 µs/cm to about 200 µs/cm.

More specifically, mixed fluid 416 may be designed to have a predetermined volume ratio of second fluid 404 to third fluid 410. Therefore, the first flow rate of second fluid 404 is sensed by PID controller 414, and the second flow rate of third fluid 410 is controlled depending on the first flow rate. For example, the second flow rate is controlled to be substantially equal to the result of the first flow rate times the predetermined volume ratio. In some embodiments, the first flow rate of second fluid 404 remains identical the whole time, and the second flow rate of third fluid 410 is controlled through PID controller 414 accordingly. In some embodiments, the volume ratio of second fluid 404 to third fluid 410 in mixed fluid 416 is in a range from about 0.1 times to about 100 time.

In some embodiments, second fluid 404 is the high conductivity fluid treated by circulating chamber 104 illustrated in FIG. 2, and third fluid 410 is deionized water. Accordingly, second fluid 404 is dynamically diluted by third fluid 410. Therefore, the conductivity of mixed fluid 416 is less than the conductivity of second fluid 404 (e.g. the high conductivity fluid).

In some embodiments, an analyzer 418 is further coupled to fluid mixing chamber 106 and PID controller 414, as shown in FIG. 4. Analyzer 418 is configured to analyze (or confirm) the volume ratio of second fluid 404 to third fluid 410 in mixed fluid 416 and to provide a signal accordingly to PID controller 414. Therefore, PID controller 414 can further adjust the second flow rate of third fluid 410 depending on the signal when needed.

In some embodiments, a container 420 is coupled to fluid mixing chamber 106. Container 420 is configured to store mixed fluid 416 temporarily, and mixed fluid 416 is expelled from container 420 by a drain 422 afterwards. However, in some other embodiments, container 420 is not required, and mixed fluid 416 is expelled directly to another chamber for another process (e.g. a cleaning process for cleaning a semiconductor structure).

In some embodiments, second fluid source 402 and third fluid source 408 continuously supply second fluid 404 and third fluid 410 to fluid mixing chamber 106 to form mixed fluid 416. In addition, mixed fluid 416 is also continuously expelled from fluid mixing chamber 106. That is, second fluid 404 and third fluid 410 are dynamically mixed through fluid mixing chamber 106. As a result, the amount of mixed fluid 416 formed in fluid mixing chamber 106 is not limited by the size of fluid mixing chamber 106. In some embodiments, the amount of mixed fluid 416 formed in fluid mixing chamber 106 is much greater than the size of fluid mixing chamber 106.

Furthermore, the second flow rate of third fluid 410 is continuously controlled by PID controller 414, and therefore mixed fluid 416 having the determined volume ratio of second fluid 404 to third fluid 410 can be formed steadily.

Figure 5:
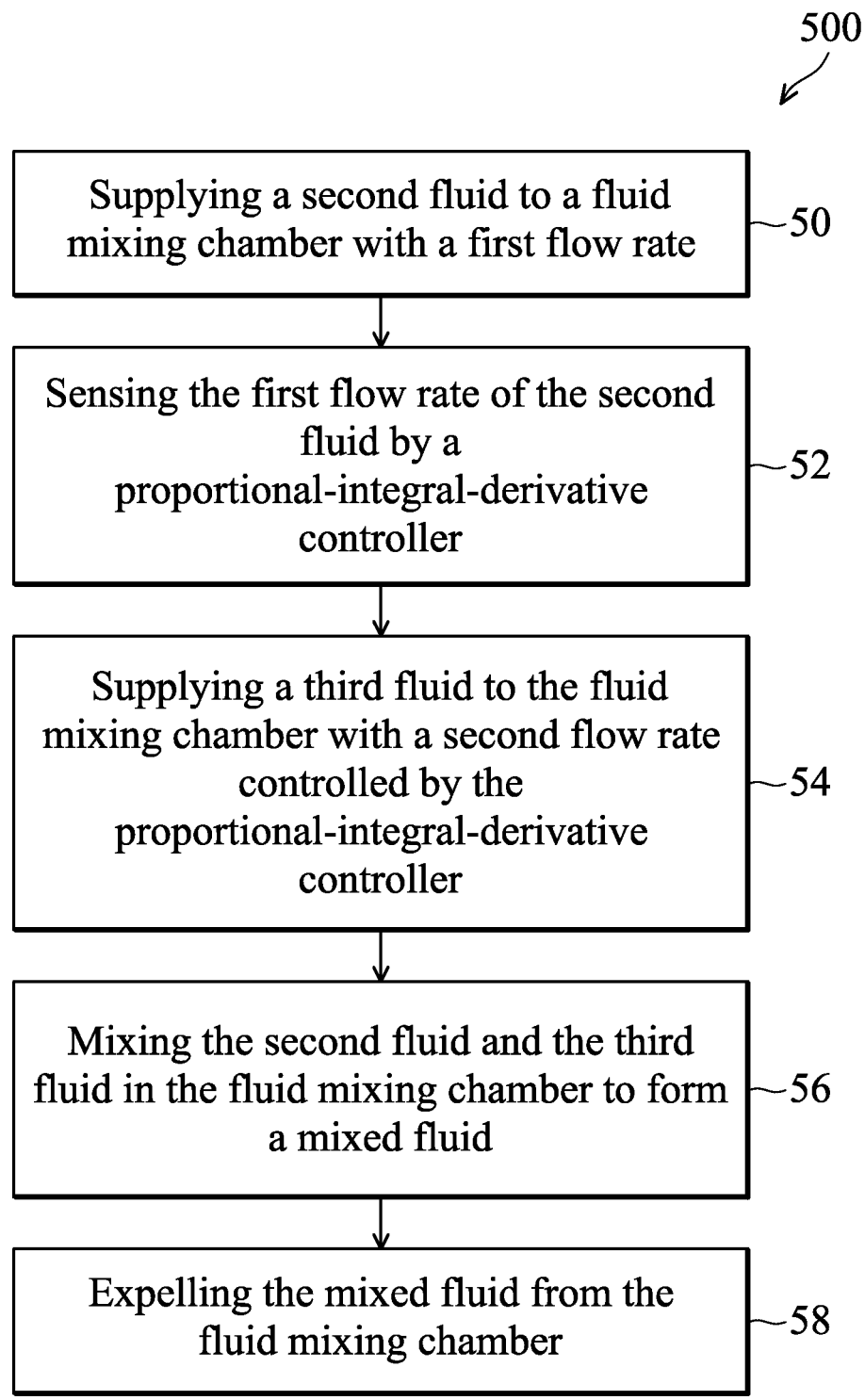
FIG. 5 illustrates a flow chart of a process for dynamically mixing a fluid with another fluid in accordance with some embodiments.

FIG. 5 illustrates a flow chart of a process 500 for dynamically mixing one fluid with another fluid in accordance with some embodiments. In some embodiments, process 500 is performed by using fluid mixing chamber 106 illustrated in FIG. 4.

In operation 50, a second fluid (e.g. second fluid 404) is supplied to a fluid mixing chamber (e.g. fluid mixing chamber 106) having a first flow rate. In operation 52, the first flow rate of the second fluid is sensed (e.g. detected) by a proportional-integral-derivative controller (e.g. PID controller 414). In operation 54, a third fluid (e.g. third fluid 410) is supplied to the fluid mixing chamber having a second flow rate controlled by the proportional-integral-derivative controller.

In some embodiments, after operation 54 is performed, the volume ratio of the second fluid to the third fluid in the mixed fluid is analyzed by an analyzer. The analyzer may be coupled to the fluid mixing chamber and the PID controller. A signal is provided by the analyzer to the PID controller for further adjusting the second flow rate of the third fluid.

Next, the second fluid and the third fluid are mixed in the fluid mixing chamber to form a mixed fluid in operation 56. In operation 58, the mixed fluid is expelled from the fluid mixing chamber. The mixed fluid expelled from the fluid mixing chamber may be further treated by other fluid treating processes or may be used directly, such as in a cleaning process for forming a semiconductor structure.

In general, a mixed fluid is formed by mixing a determined volume of one fluid mixed with a determined volume of another fluid. Therefore, a storage chamber is required to store the mixed fluid, and the size of the storage chamber should be greater than the sum of the volume of the two kinds of fluid. In addition, when the mixed fluid is completely consumed, the process described above needs to be repeated again. Therefore, the formation of the mixed fluid may be time consuming and a large space is required for storing the mixed fluid.

However, mixed fluid 416 formed in fluid mixing chamber 106 illustrated in FIGS. 4 and 5 and described above can be formed rapidly in fluid mixing chamber 106, which is relatively small. More specifically, mixed fluid 416 can be formed and expelled from fluid mixing chamber 106 at the same time. Therefore, the formation of mixed fluid is not limited by the size of the storage chamber. Furthermore, a great amount of mixed fluid 416 can be formed without using any huge storage chamber.

Figure 6:
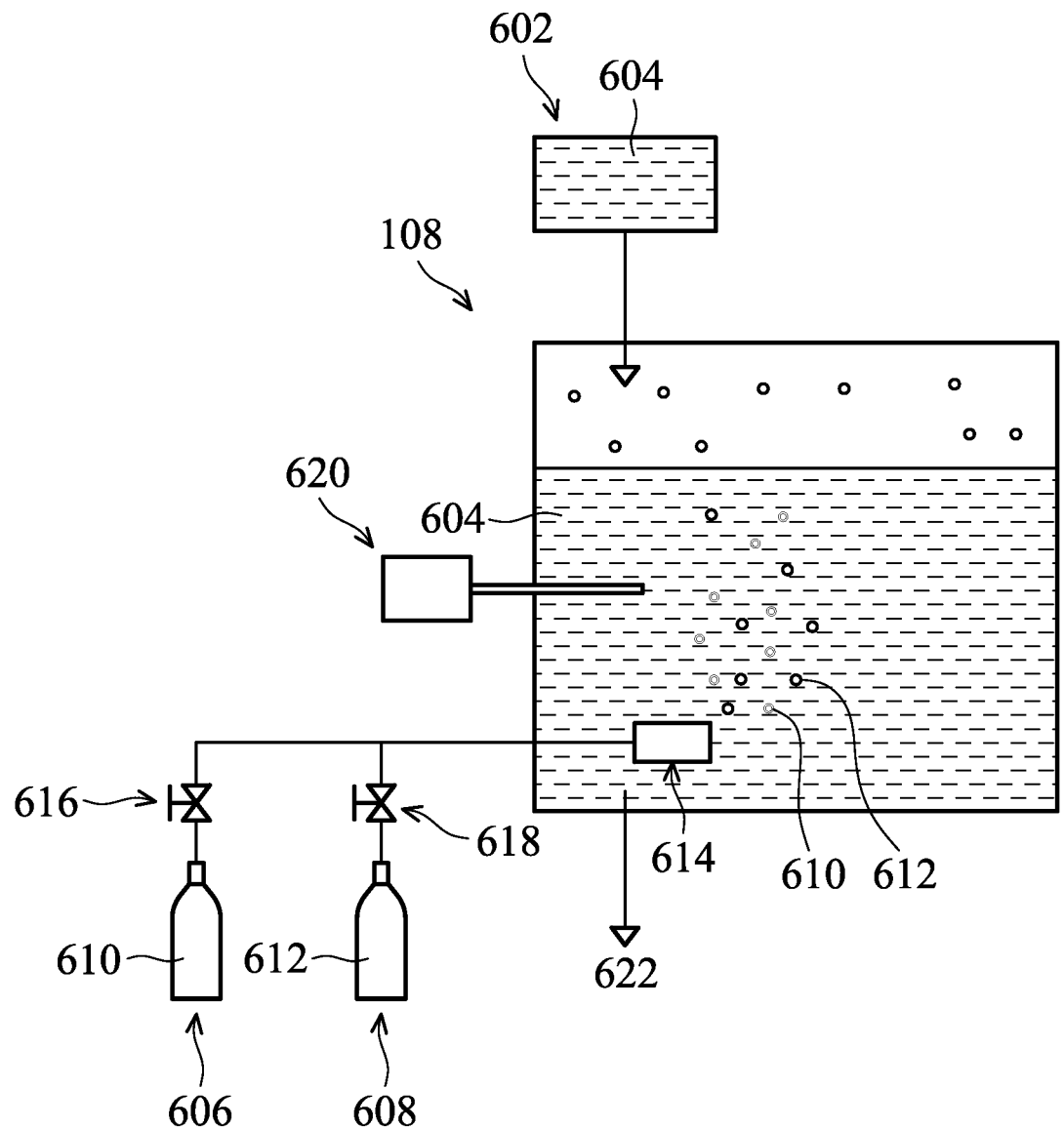
FIG. 6 illustrates a schematic drawing of a gas mixing chamber in accordance with some embodiments.

FIG. 6 illustrates a schematic drawing of gas mixing chamber 108 in accordance with some embodiments. A fourth fluid source 602 is coupled to gas mixing chamber 108 for supplying fourth fluid 604 into gas mixing chamber 108. In some embodiments, fourth fluid 604 are solutions such as a fluid having a designed conductivity or concentration. In some embodiments, fourth fluid 604 is mixed fluid 416 illustrated in FIG. 4. A valve (not shown) may be in communication with fourth fluid source 602 and gas mixing chamber 108 for controlling the amount of fourth fluid 604 being introduced to gas mixing chamber 108.

A second gas source 606 and a third gas source 608 are coupled to gas mixing chamber 108 in accordance with some embodiments. Second gas source 606 is configured to introduce a second gas 610 to gas mixing chamber 108, and third gas source 608 is configured to introduce a third gas 612 to gas mixing chamber 108. In some embodiments, second gas 610 and third gas 612 are introduced to fourth fluid 604 in gas mixing chamber 108 by a gas diffuser 614. As shown in FIG. 6, second gas source 606 and third gas source 608 are both in communication with gas diffuser 614, and gas diffuser 614 extends into fourth fluid 604.

In some embodiments, valves 616 and 618 are respectively in communication with second gas source 606 and third gas source 608. Valves 616 and 618 are configured to control the amount of second gas 610 and third gas 612 being introduced to fourth fluid 604. In some embodiments, a volume ratio of second gas 610 to third gas 612 is in a range from about 1:99 to about 99:1. In some embodiments, the volume ratio of second gas 610 to third gas 612 is in a range from about 1:20 to about 5:1.

As shown in FIG. 6, second gas 610 and third gas 612 are both introduced to fourth fluid 604, such that a portion of second gas 610 and a portion of third gas 612 can be dissolved in fourth fluid 604. Accordingly, a conductivity-modified fluid is formed. In addition, the conductivity of the conductivity-modified fluid can be controlled by adjusting the volume ratio of second gas 610 to third gas 612 introduced to fourth fluid 604.

In some embodiments, second gas 610 and third gas 612 respectively comprise carbon dioxide, nitrogen, oxygen, argon, xenon, helium, krypton, or combinations thereof. In some embodiments, second gas 610 is carbon dioxide, and third gas 612 is nitrogen.

In some embodiments, a conductivity meter 620 is coupled to gas mixing chamber 108. Conductivity meter 620 is configured to measure the conductivity of fourth fluid 604. When the conductivity of fourth fluid 604 higher or lower set point, second gas 610 and third gas 612 are both introduced to fourth fluid 604 to adjust fluid's conductivity of fourth fluid 604. In some embodiments, the conductivity of the conductivity-modified fluid is in a range from about 1 µs/cm to about 100 µs/cm.

The resulting conductivity-modified fluid may be used to clean a semiconductor structure in a cleaning process. In some embodiments, the semiconductor structure includes a substrate, a gate structure, source and drain regions, or combinations thereof.

Figure 7:
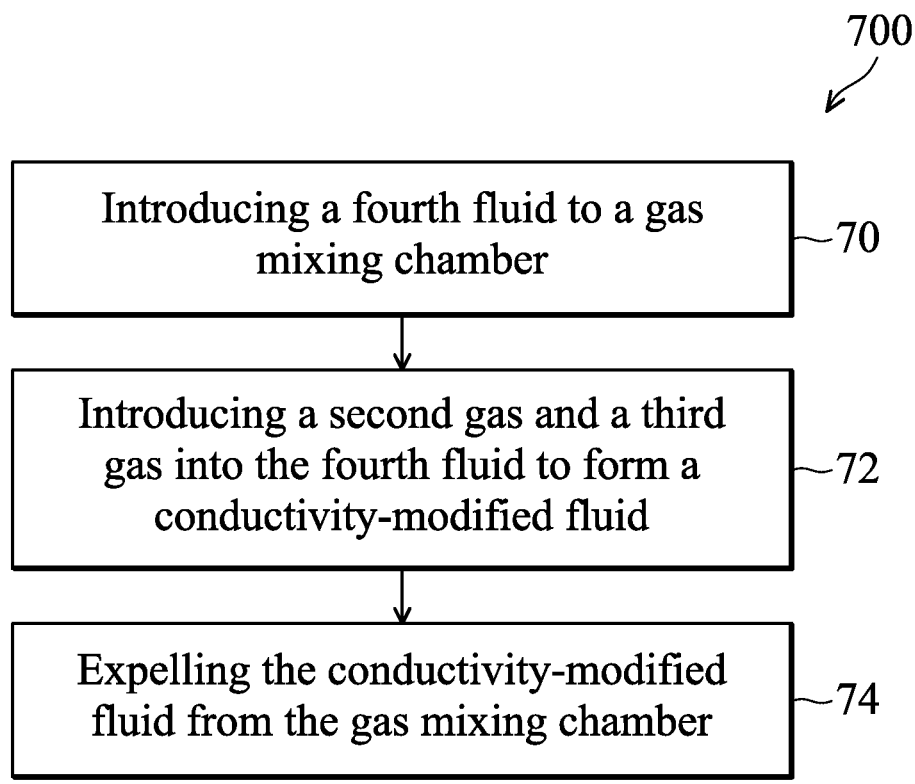
FIG. 7 illustrates a flow chart of a process for forming a conductivity-modified fluid in accordance with some embodiments.

FIG. 7 illustrates a flow chart of a process 700 for forming a conductivity-modified fluid in accordance with some embodiments. In some embodiments, process 700 is performed by using gas mixing chamber 108 illustrated in FIG. 6.

In operation 70, a fourth fluid (e.g. fourth fluid 604) is introduced to a gas mixing chamber (e.g. gas mixing chamber 108). In operation 72, a second gas (e.g. second gas 610) and a third gas (e.g. third gas 612) are introduced to the fourth fluid to form a conductivity-modified fluid. In operation 74, the conductivity-modified fluid is drained out from the gas mixing chamber.

In general, it is difficult to accurately control the conductivity of a fluid by adding a gas since the dissolving amount and dissolving rate of the gas are difficult to control. However, as illustrated in FIGS. 6 and 7 and described above, the conductivity of fourth fluid 604 is modified by introducing second gas 610 and third gas 612 therein. More specifically, the conductivity of the resulting conductivity-modified fluid can be controlled by adjusting the volume ratio of second gas 610 to third gas 612 introduced to fourth fluid 604.

For example, when the volume ratio of second gas 610 (e.g. $CO_2$) to third gas 612 (e.g. $N_2$) is about 15.7:84.3, the conductivity of the conductivity-modified fluid will be about 33 µs/cc (under a pressure of about 3 kg/cm$^2$). Accordingly, when the conductivity of fourth fluid 604 is too low, $CO_2$ dissolved in fourth fluid 604 will be expelled by $N_2$. Therefore, the conductivity of the resulting conductivity-modified fluid can be controlled to about 33 μs/cc. On the other hand, when the conductivity of fourth fluid 604 is too high, $CO_2$ will be further dissolved in fourth fluid 604, and the resulting conductivity-modified fluid can have the determined conductivity.

Figure 8:
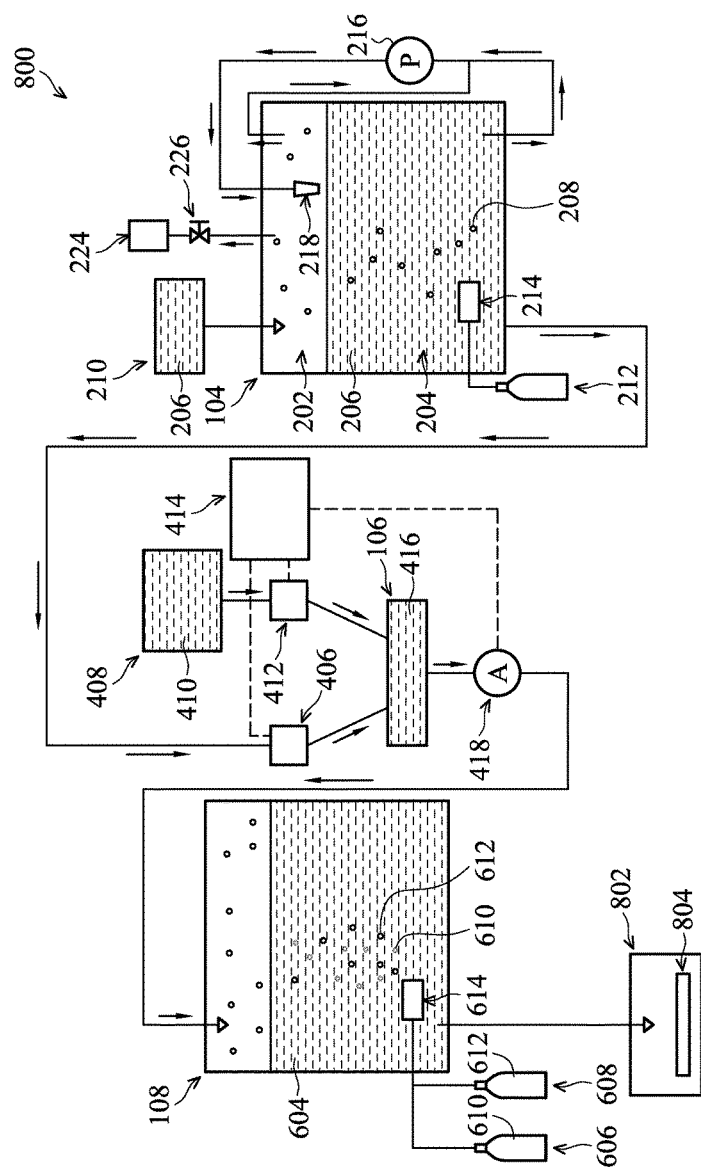
FIG. 8 illustrates a schematic drawing of a system for treating a fluid in accordance with some embodiments.

FIG. 8 illustrates a schematic drawing of a system 800 for treating a fluid in accordance with some embodiments. System 800 includes circulating chamber 104 illustrated in FIG. 2, fluid mixing chamber 106 illustrated in FIG. 4, and gas mixing chamber 108 illustrated in FIG. 6. Fluid mixing chamber 106 is coupled to circulating chamber 104, and gas mixing chamber 108 is coupled to fluid mixing chamber 106. It should be noted that system 800 illustrated in FIG. 8 is merely an example which has been simplified for clarity. Other units may also be additionally or alternatively used in system 800 in some other embodiments, and the scope of the disclosure is not intended to be limiting.

As shown in FIG. 8, first fluid source 210 is coupled to circulating chamber 104 for supplying first fluid 206, such as deionized water, into fluid containing portion 204 of circulating chamber 104 in accordance with some embodiments.

In addition, first gas source 212 is coupled to circulating chamber 104 for introducing first gas 208, such as carbon dioxide, to circulating chamber 104 by a gas diffuser 214 in accordance with some embodiments. Accordingly, a portion of first gas 208 is dissolved in first fluid 206. Since first gas 208 is transformed to small bubbles by gas diffuser 214, the dissolving rate of first gas 208 in first fluid 206 is improved.

Furthermore, a portion of first gas 208 passes through first fluid 206 to reach head space portion 202 of circulating chamber 104. Therefore, head space portion 202 of circulating chamber 104 also contains a portion of first gas 208.

System 800 also includes pump 216 and two-fluid nozzle 218 coupled to circulating chamber 104 in accordance with some embodiments. Pump 216 is configured to draw out first gas 208 from head space portion 202 and first fluid 206 from fluid-containing portion 204, and two-fluid nozzle 218 is configured to spray the mixture into circulating chamber 104. Furthermore, first gas 208 in head space portion 202 is sucked into two-fluid nozzle 218 to be mixed with the mixture drawn by pump 216.

Therefore, first gas 208 drawn by pump 216 is mixed with first fluid 206 for the second time to form a mixture, and the mixture is further transferred to two-fluid nozzle 218 and is sprayed back to circulating chamber 104. In addition, first gas 208 in head space portion 202 is also sucked into two-fluid nozzle 218 to be mixed with the mixture for the third time. Therefore, the dissolving rate of first gas 208 is further improved by using circulating system 215.

After first fluid 206 is transformed into a high conductivity fluid having a determined value, the high conductivity fluid is transferred to fluid mixing chamber 106. A first flow meter 406 is coupled to fluid mixing chamber 106 for measuring the first flow rate of the high conductivity fluid. In addition, third fluid source 408 and second flow meter 412 are also coupled to fluid mixing chamber 106. Third fluid source 408 is configured to supply third fluid 410 (e.g. deionized water) to fluid mixing chamber 106, and second flow meter 412 is configured to measure the second flow rate of third fluid 408. That is, high conductivity fluid is dynamically diluted by third fluid 410.

Furthermore, proportional-integral-derivative (PID) controller 414 is coupled to first flow meter 406 and second flow meter 412 in accordance with some embodiments. PID controller 414 is configured to sense the first flow rate of the high conductivity fluid and to control the second flow rate of third fluid 410 according to the sensing result.

The high conductivity fluid and third fluid 410 are mixed in fluid mixing chamber 106 to form mixed fluid 416 in accordance with some embodiments. More specifically, the first flow rate of the high conductivity fluid is sensed by PID controller 414, and the second flow rate of third fluid 410 is controlled according to the first flow rate. For example, the second flow rate is controlled to be substantially equal to the result of the first flow rate timing the predetermined volume ratio.

In some embodiments, analyzer 418 is further coupled to fluid mixing chamber 106 and PID controller 414 for analyzing the volume ratio of the high conductivity fluid to third fluid 410 in mixed fluid 416. After the volume ratio is analyzed, a signal provided by analyzer 418 is transmitted to PID controller 414, and PID controller 414 further adjusts the second flow rate of third fluid 410 according to the signal.

In addition, the high conductivity fluid and third fluid 410 are continuously introduced to fluid mixing chamber 106 to form mixed fluid 416. Moreover, mixed fluid 416 may be continuously expelled from fluid mixing chamber 106 to gas mixing chamber 108. That is, second fluid 404 and third fluid 410 are dynamically mixed through fluid mixing chamber 106, and a great amount of mixed fluid 416 can be formed rapidly without using a huge container.

Mixed fluid 416 is introduced to gas mixing chamber 108, and second gas 610 (e.g. carbon dioxide) and third gas 612 (e.g. nitrogen) are also introduced to gas mixing chamber 108 from second gas source 606 and third gas source 608 by gas diffuser 614. As shown in FIG. 6, second gas source 606 and third gas source 608 are both in communication with gas diffuser 614, and gas diffuser 614 extends into fourth fluid 604. Therefore, a portion of second gas 610 and a portion of third gas 612 are dissolved in mixed fluid 416 to form the conductivity-modified fluid. The conductivity of the conductivity-modified fluid is altered by dissolving second gas 610 and third gas 612 therein. In some embodiments, the conductivity of the conductivity-modified fluid is in a range from about 1 μs/cm to about 100 μs/cm.

Next, the conductivity-modified fluid is drained out from gas mixing chamber 108 and is introduced to a semiconductor forming chamber 802 in accordance with some embodiments. As shown in FIG. 8, a semiconductor structure 804 is positioned in semiconductor forming chamber 802. In some embodiments, semiconductor structure 804 includes a substrate, a gate structure, source and drain regions, or combinations thereof.

In some embodiments, at least a portion of semiconductor structure 804 is formed in semiconductor forming chamber 802, and the conductivity-modified fluid is introduced to semiconductor forming chamber 802 to clean semiconductor structure 804 during or after semiconductor structure 804 is formed. For example, a gate structure may be formed in semiconductor forming chamber 802, and the conductivity-modified fluid is introduced to semiconductor forming chamber 802 to remove chemicals over the gate structure after the gate structure is formed. In some embodiments, the conductivity-modified fluid is used in a cleaning process, a substrate forming process, a well forming process, a gate forming process, a polysilicon forming process, a lightly doped drain (LDD) forming process, a spacer forming process, a source/drain forming process, a photoresist forming process, an etching process, and/or a interlayer dielectric forming process.

Figure 9A:
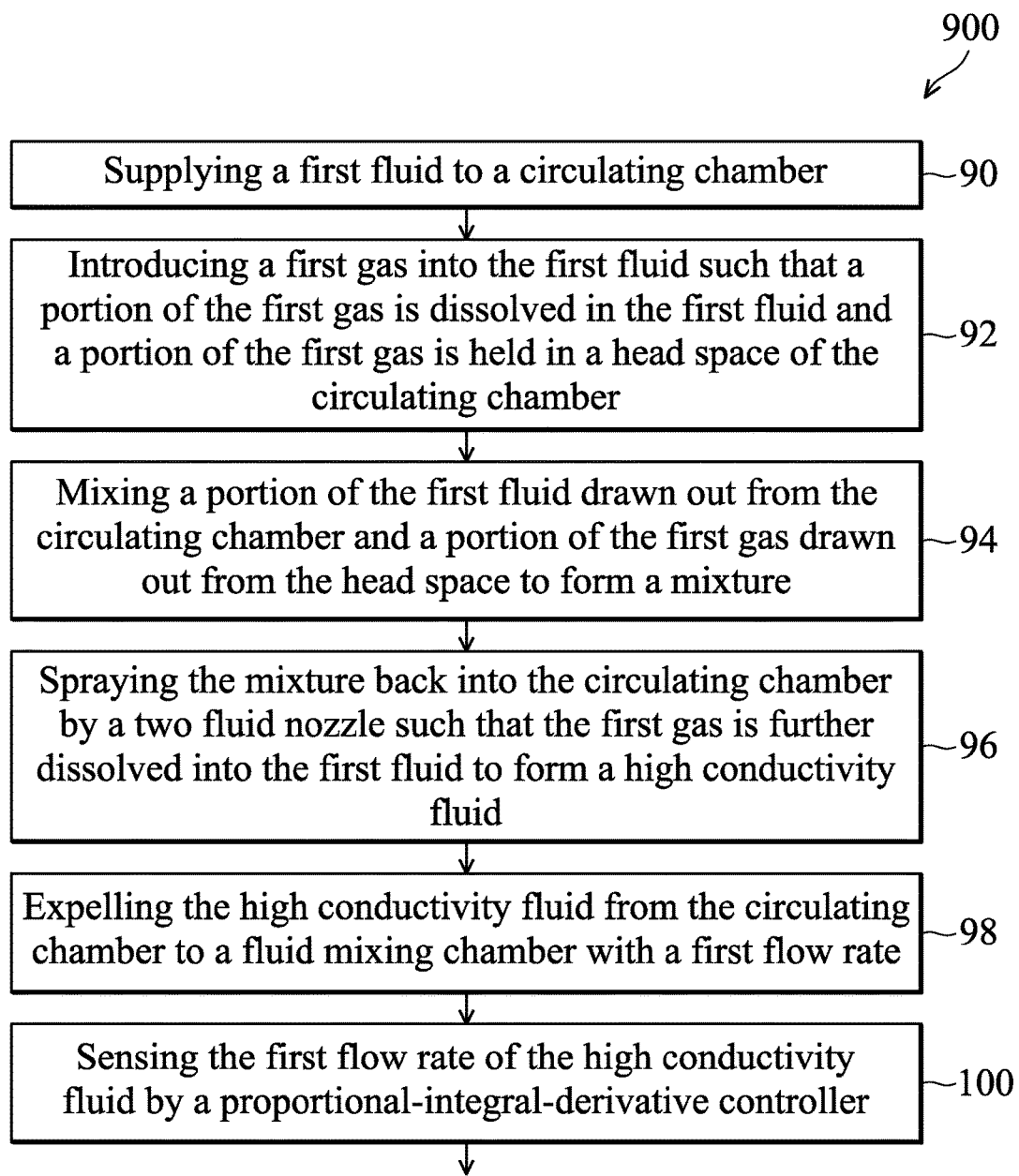
FIGS. 9A and 9B illustrate a flow chart of a process for treating a fluid and cleaning a semiconductor structure by the treated fluid in accordance with some embodiments.
Figure 9B:
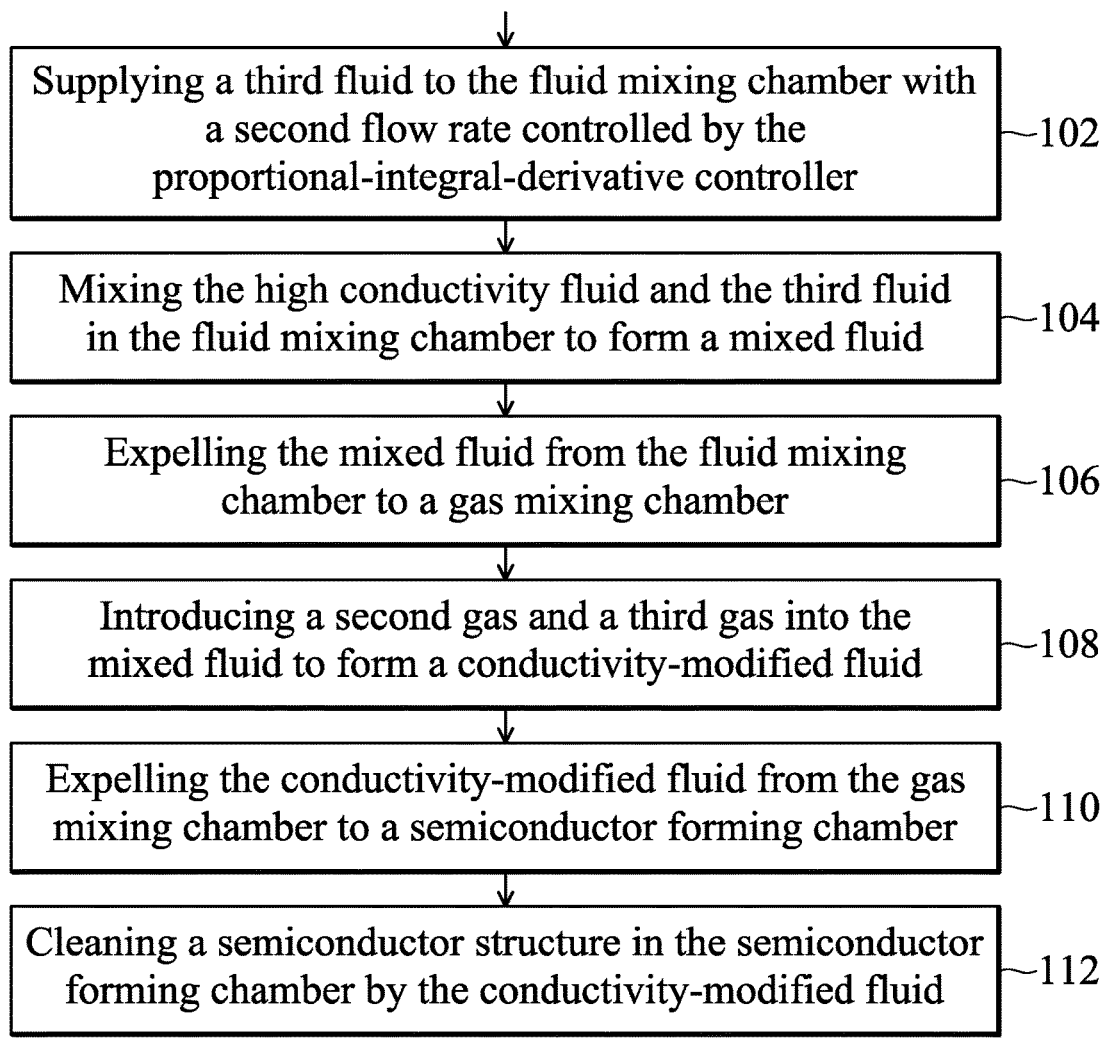

FIGS. 9A and 9B illustrate a flow chart of a process 900 for treating a fluid and cleaning a semiconductor structure by the treated fluid in accordance with some embodiments. In some embodiments, process 900 is performed by using system 800 illustrated in FIG. 8.

In operation 90, a first fluid (e.g. first fluid 206) is supplied to a circulating chamber (e.g. circulating chamber 104). In operation 92, a first gas (e.g. first gas 208) is introduced to the first fluid, such that a portion of the first gas is dissolved in the first fluid and a portion of the first gas is held in a head space portion (e.g. head space portion 202) of the circulating chamber. In operation 94, a portion of the first fluid drained out from the circulating chamber and a portion of the first gas drawn out from the head space portion are mixed to form a mixture. As described previously, the first fluid and the first gas may be drained out by a pump (e.g. pump 216). In operation 96, the mixture is sprayed back into the circulating chamber by a two-fluid nozzle (e.g. two-fluid nozzle 218). In some embodiments, the first gas in the head space portion is sucked in by the two-fluid nozzle to mix with the mixture and sprayed out by the two-fluid nozzle afterwards.

As described previously, the first gas is continuously mixed with the first fluid by using the circulating system including the pump and the two-fluid nozzle. Therefore, the dissolving rate of the first gas in the first fluid is improved, and a high conductivity fluid is formed.

In operation 98, the high conductivity fluid is transferred from the circulating chamber to a fluid mixing chamber (e.g. fluid mixing chamber 106) at a first flow rate. In operation 100, the first flow rate of the second fluid is sensed by a proportional-integral-derivative controller (e.g. PID controller 414). In operation 102, a third fluid (e.g. third fluid 410) is supplied to the fluid mixing chamber at a second flow rate controlled by the proportional-integral-derivative controller. In operation 104, the high conductivity fluid and the third fluid are mixed in the fluid mixing chamber to form a mixed fluid (e.g. mixed fluid 416). That is, the high conductivity fluid is diluted by the third fluid to form the mixed fluid. Therefore, the conductivity of the high conductivity fluid is greater than the conductivity of the mixed fluid.

In operation 106, the mixed fluid is drained from the fluid mixing chamber to a gas mixing chamber (e.g. gas mixing chamber 108). In operation 108, a second gas (e.g. second gas 610) and a third gas (e.g. third gas 612) are introduced to the mixed fluid to form a conductivity-modified fluid. The conductivity of the conductivity-modified fluid is relevant to the volume ratio of the second gas to the third gas. Therefore, the conductivity-modified fluid having a determined conductivity can be formed by adjusting the volume ratio of the second gas to the third gas introduced to the mixed fluid.

In operation 110, the conductivity-modified fluid is transferred from the gas mixing chamber to a semiconductor forming chamber (e.g. semiconductor forming chamber 802). In step 112, a semiconductor structure (e.g. semiconductor structure 804) is cleaned by the conductivity-modified fluid in the semiconductor forming chamber.

In some embodiments, the conductivity-modified fluid is formed by treating deionized water with carbon dioxide and nitrogen. Therefore, the conductivity-modified fluid does not include additional compounds, which may damage or react with the semiconductor structure. In addition, the conductivity-modified fluid may have a relatively high conductivity, and therefore static electricity on the surface of the semiconductor structure may also be reduced.

In addition, it should be noted that the conductivity-modified fluid may be used in other processes, such as processes for removing chemicals and/or residues, cleaning benches hoods and/or equipment used for forming a semiconductor structure, and/or cleaning wafers and/or chips.

As described previously, circulating chamber 104 can be used to introduce first gas 208 into first fluid 206 to form the high conductivity fluid in accordance with some embodiments. The dissolving rate of first gas 208 in first fluid 206 is improved by circulating system 215 including pump 216 and two-fluid nozzle 218.

Moreover, first fluid 206 is continuously circulated by circulating system 215. Therefore, the uniformity of the conductivity of first fluid 206 in circulating chamber 104 is also improved. Furthermore, first gas 206 is repeatedly mixed with first fluid 206 in the circulating chamber 104, and therefore less first gas 206 is utilized to achieve the determined conductivity. Therefore, the cost for forming the high conductivity fluid is reduced.

After the high conductivity fluid is formed, the high conductivity fluid is transferred to fluid mixing chamber 106 to form mixed fluid 416. That is, the high conductivity fluid is diluted by third fluid 410. More specifically, the high conductivity fluid and third fluid 410 are dynamically mixed in fluid mixing chamber 106, such that mixed fluid 416 can be formed rapidly.

In addition, mixed fluid 416 can be formed and expelled from fluid mixing chamber 106 at the same time. Therefore, the formation of mixed fluid is not limited by the size of the storage chamber, and a great amount of mixed fluid 416 can be formed without using any huge storage chamber.

Afterwards, the conductivity of mixed fluid 416 is modified to form the conductivity-modified fluid by introducing second gas 610 and third gas 612 therein. More specifically, the conductivity of resulting conductivity-modified fluid can be controlled by adjusting the volume ratio of second gas 610 to third gas 612 introduced to mixed fluid 416.

In addition, the conductivity-modified fluid is relatively clean (without containing other impurities) and may be applicable for using in a cleaning process. In addition, the conductivity-modified fluid may have a relatively high conductivity, and therefore static electricity on the surface of the semiconductor structure may also be reduced.

Embodiments for treating a fluid are provided. A first fluid is treated by a circulating chamber in accordance with some embodiments. The first fluid is introduced to the circulating chamber, and a first gas is introduced to the first fluid. In addition, a circulating system including a pump and a two-fluid nozzle is further coupled to the circulating chamber to improve the dissolving rate of the first gas in the first fluid.

A second fluid and a third fluid are dynamically mixed in a fluid mixing chamber to form a mixed fluid in accordance with some embodiments. The second fluid has a first flow rate, and a proportional-integral-derivative controller is used to measure the first flow rate and to control a second flow rate of a third fluid according to the first flow rate. Therefore, a great amount of the mixed fluid can be formed rapidly.

A fourth fluid is treated by a second gas and a third gas in a gas mixing chamber to form a conductivity-modified fluid in accordance with some embodiments. The conductivity of the conductivity-modified fluid can be controlled by adjusting the volume ratio of the second gas to the third gas. In addition, the circulating chamber is coupled to the fluid mixing chamber, and the fluid mixing chamber is coupled to the gas mixing chamber in accordance with some embodiments. The treated fluid may have a relatively high conductivity and may be used in a cleaning process.

In some embodiments, a process for treating a fluid is provided. The process for treating a fluid includes supplying a first fluid to a circulating chamber and introducing a first gas to the first fluid. A portion of the first gas is dissolved in the first fluid and a portion of the first gas is held in a head space portion of the circulating chamber. The process further includes mixing a portion of the first fluid drawn out from the circulating chamber and a portion of the first gas drawn out from the head space portion to form a mixture. The process further includes spraying the mixture back into the circulating chamber by a two-fluid nozzle. In addition, the first gas is further dissolved into the first fluid to form a high conductivity fluid. The process further includes draining the high conductivity fluid from the circulating chamber.

In some embodiments, a process for treating a fluid is provided. The process for treating a fluid includes supplying a second fluid to a fluid mixing chamber at a first flow rate and sensing the first flow rate of the second fluid by a proportional-integral-derivative controller. The process further includes supplying a third fluid to the fluid mixing chamber at a second flow rate controlled by the proportional-integral-derivative controller. The process further includes mixing the second fluid and the third fluid in the fluid mixing chamber to form a mixed fluid. The process further includes draining the mixed fluid from the fluid mixing chamber, and a conductivity of the mixed fluid is less than a conductivity of the second fluid.

In some embodiments, a system for treating a fluid is provided. The system for treating a fluid includes a circulating chamber having a head space portion and a fluid-containing portion. The system further includes a first fluid source coupled to the circulating chamber for introducing a first fluid into the fluid-containing portion. The system further includes a first gas source coupled to the circulating chamber for introducing a first gas to the first fluid and the head space portion by a gas diffuser. The system also includes a pump coupled to the circulating chamber for drawing out the first gas from the head space portion and the first fluid from the fluid-containing portion to form a mixture. The system further includes a two-fluid nozzle coupled to the pump and positioned in the head space portion for spraying the mixture back to the circulating chamber to transform the first fluid into a high conductivity fluid.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A process for treating a fluid, comprising:
   supplying a first fluid to a liquid-containing portion of a circulating chamber;
   introducing a first gas into the liquid-containing portion, such that a portion of the first gas is dissolved in the first fluid and a portion of the first gas passes through the first fluid and enters a head space portion of the circulating chamber;
   mixing a portion of the first fluid drawn out from the liquid-containing portion and a portion of the first gas drawn out from the head space portion to form a mixture;
   spraying the mixture back into the circulating chamber by a two-fluid nozzle, to form a high conductivity fluid, wherein a portion of the first gas in the head space portion is sucked into the two-fluid nozzle and mixed with the mixture in the two-fluid nozzle;
   draining the high conductivity fluid from the circulating chamber;
   supplying a second fluid to a fluid mixing chamber at a first flow rate, wherein the second fluid is the high conductivity fluid drained out from the circulating chamber;
   sensing the first flow rate of the second fluid by a proportional-integral-derivative controller;
   supplying a third fluid to the fluid mixing chamber at a second flow rate controlled by the proportional-integral-derivative controller;
   mixing the second fluid and the third fluid in the fluid mixing chamber to form a mixed fluid; and
   draining the mixed fluid from the fluid mixing chamber, wherein a conductivity of the mixed fluid is less than a conductivity of the second fluid.

2. The process for treating a fluid as claimed in claim 1, further comprising:
   controlling a pressure of the circulating chamber by a back pressure regulator.

3. The process for treating a fluid as claimed in claim 2, wherein the pressure of the circulating chamber is in a range from about 1 atm to about 10 atm.

4. The process for treating a fluid as claimed in claim 1, wherein the first gas comprises carbon dioxide, nitrogen, oxygen, argon, xenon, helium, krypton, or combinations thereof.

5. The process for treating a fluid as claimed in claim 1, wherein the first fluid and the third fluid are both deionized water.

6. The process for treating a fluid as claimed in claim 1, further comprising:
   analyzing a volume ratio of the second fluid to the third fluid in the mixed fluid by an
   analyzer, wherein the analyzer is coupled to the fluid mixing chamber and the proportional-integral-derivative controller; and
   providing a signal from the analyzer to the proportional-integral-derivative controller for adjusting the second flow rate of the third fluid.

7. The process for treating a fluid as claimed in claim 1, further comprising:
   introducing the mixed fluid to a gas mixing chamber;
   introducing a second gas and a third gas to the mixed fluid to form a conductivity-modified fluid; and
   draining the conductivity-modified fluid from the gas mixing chamber.

8. The process for treating a fluid as claimed in claim 7, wherein the second gas is carbon dioxide and the third gas is nitrogen.

9. The process for treating a fluid as claimed in claim 7, wherein the conductivity of the mixed fluid is less than a conductivity of the conductivity-modified fluid.

10. The process for treating a fluid as claimed in claim 7, further comprising:
cleaning a semiconductor structure by the conductivity-modified fluid.

11. A process for treating a fluid, comprising:
introducing a first fluid to a circulating chamber;
introducing a first gas into the first fluid, such that a portion of the first gas is dissolved in the first fluid and a portion of the first gas passes through the first fluid and enters a head space portion of the circulating chamber;
mixing a portion of the first fluid drawn out from the circulating chamber and a portion of the first gas drawn out from the head space portion to form a mixture;
spraying the mixture back into the circulating chamber by a two-fluid nozzle to form a high conductivity fluid, wherein a portion of the first gas in the head space portion is sucked into the two-fluid nozzle and mixed with the mixture in the two-fluid nozzle;
introducing the high conductivity fluid to a fluid mixing chamber at a first flow rate;
sensing the first flow rate of the high conductivity fluid by a proportional-integral-derivative controller;
introducing a third fluid to the fluid mixing chamber at a second flow rate controlled by the proportional-integral-derivative controller;
mixing the high conductivity fluid and the third fluid so that the high conductivity fluid is diluted by the third fluid in the fluid mixing chamber to form a mixed fluid; and
draining the mixed fluid from the fluid mixing chamber.

12. The process for treating a fluid as claimed in claim 11, wherein a conductivity of the mixed fluid is less than a conductivity of the high conductivity fluid.

13. The process for treating a fluid as claimed in claim 11, further comprising:
introducing the mixed fluid to a gas mixing chamber;
introducing a second gas and a third gas to the mixed fluid to form a conductivity-modified fluid; and
draining the conductivity-modified fluid from the gas mixing chamber.

14. The process for treating a fluid as claimed in claim 11, wherein the first fluid is deionized water, and the first gas is carbon dioxide.

15. The process for treating a fluid as claimed in claim 13, wherein a conductivity of the mixed fluid is less than a conductivity of the high conductivity fluid, and the conductivity of the mixed fluid is less than a conductivity of the conductivity-modified fluid.

16. A process for treating a fluid, comprising:
introducing a first fluid to a circulating chamber;
introducing a first gas into the first fluid, such that a portion of the first gas is dissolved in the first fluid and a portion of the first gas passes through the first fluid and enters a head space portion of the circulating chamber;
mixing a portion of the first fluid drawn out from the circulating chamber and a portion of the first gas drawn out from the head space portion to form a mixture;
sucking a portion of the first gas from the head space portion to mix with the mixture and spraying the mixture back into the circulating chamber to form a high conductivity fluid;
draining the high conductivity fluid from the circulating chamber to a fluid mixing chamber;
introducing a third fluid to the fluid mixing chamber to form a mixed fluid, wherein a conductivity of the mixed fluid is less than a conductivity of the high conductivity fluid;
introducing the mixed fluid to a gas mixing chamber; and
introducing a second gas and a third gas to the mixed fluid to form a conductivity-modified fluid.

17. The process for treating a fluid as claimed in claim 16, wherein the second gas is carbon dioxide and the third gas is nitrogen.

18. The process for treating a fluid as claimed in claim 16, wherein the conductivity of the mixed fluid is less than a conductivity of the conductivity-modified fluid.

* * * * *